United States Patent [19]

Jodoin

[11] Patent Number: 4,636,918
[45] Date of Patent: Jan. 13, 1987

[54] DECOUPLED INTEGRATED CIRCUIT PACKAGE

[75] Inventor: Raymond C. Jodoin, Scottsdale, Ariz.

[73] Assignee: Rogers Corporation, Rogers, Conn.

[21] Appl. No.: 683,344

[22] Filed: Dec. 19, 1984

Related U.S. Application Data

[63] Continuation-in-part of Ser. No. 403,408, Jul. 30, 1982, Pat. No. 4,502,101.

[51] Int. Cl.⁴ .............................................. H05K 1/18
[52] U.S. Cl. .................... 361/405; 339/147 R; 357/75; 361/321; 361/386
[58] Field of Search ....... 339/176 MP, 147 R, 17 CF; 361/321, 400, 404, 405, 417, 419, 386–388, 389, 396, 421, 306, 413, 410; 357/74, 70, 72, 75

[56] References Cited

U.S. PATENT DOCUMENTS

| 3,277,354 | 10/1966 | Ikeda | 361/321 |
| 3,348,568 | 10/1967 | Stark | 361/321 |
| 3,646,246 | 2/1972 | Olney, Jr. | 361/400 |
| 3,660,728 | 5/1972 | Carter | 361/413 |
| 3,753,046 | 8/1973 | Towell | 361/400 |
| 3,880,493 | 4/1975 | Lockhart, Jr. | 339/147 R |
| 3,912,984 | 10/1975 | Lockhart, Jr. | 361/400 |
| 4,209,754 | 6/1980 | Shiki | 361/321 |
| 4,356,532 | 10/1982 | Donaher | 361/393 |
| 4,394,713 | 7/1983 | Yoshida | 361/433 |
| 4,521,828 | 6/1985 | Fanning | 361/386 |

FOREIGN PATENT DOCUMENTS

| 112845 | 2/1979 | Japan . |
| 113040 | 2/1983 | Japan . |

Primary Examiner—G. P. Tolin
Attorney, Agent, or Firm—Fishman & Dionne

[57] ABSTRACT

High frequency noise is decoupled from a bus conductor which supplies power to an integrated circuit by providing a metalized ceramic chip either on top of an integrated circuit or on the back side of a circuit board in direct alignment with an integrated circuit. The ceramic chip is provided with a pair of rectangular leads, connected to respective of the metalized opposite surfaces thereof, which are respectively connected to the power supply leads of the integrated circuit.

4 Claims, 6 Drawing Figures

DECOUPLED INTEGRATED CIRCUIT PACKAGE

CROSS-REFERENCE TO RELATED APPLICATION

This application is a continuation-in-part of application Ser. No. 403,408 filed July 30, 1982, now U.S. Pat. No. 4,502,101.

BACKGROUND OF THE INVENTION (1) Field of the Invention

The present invention relates to microelectronics and particularly to improving the high frequency performance of integrated circuits which, in part, have very fast switching times. More specifically, this invention is directed to methods of and apparatus for decoupling switching transients and other high frequency noise from the power supplies for integrated circuits. Accordingly, the general objects of the present invention are to provide novel and improved methods and articles of such character.

(2) Description of the Prior Art

It is well known in the field of microelectronics that high frequency operation, particularly the switching of integrated circuits, can result in switching transients being coupled into the power supply circuit. There have, in the past, been several techniques proposed for preventing the coupling of undesired high frequency interference into the power supply circuit for an integrated circuit wherein the noise is generated. Thus, for example, it is known to employ low pass filters which are connected between the common power supply leads of an integrated circuit. Such low pass filters include decoupling capacitors which are mounted on a printed circuit board and connected by traces on the board to the plated through-holes which receive the ground and power supply connection leads of the integrated circuit. This technique has several deficiencies. The most serious of these deficiencies resides in the fact that the circuits including the capacitors become highly inductive at high frequencies as a consequence of the shape and length of the leads and interconnection traces between the discrete capacitor and the integrated circuit which it decouples. The inductance of the leads and printed circuit board traces may be sufficiently high to nullify the effect of the capacitor in the circuit. A second serious deficiency resides in the inherent volumetric inefficiency incident to employing a low pass filter which requires a discrete capacitor. The space requirements of the capacitor and the interconnection traces on the printed circuit board adversely affect the component packaging density which can be achieved.

In an effort to overcome the above-discussed deficiencies associated with the use of low-pass filters with discrete decoupling capacitors mounted on a printed circuit board, it has been proposed to provide sockets which receive the integrated circuit and which have a decoupling capacitor formed integrally therewith. An example of this approach may be seen from U.S. Pat. No. 3,880,493. While an improvement over the previous technique of employing low-pass filters, the technique of U.S. Pat. No. 3,880,493 also has certain inherent deficiencies. Firstly, the socket with integral capacitor is a comparatively complex and thus expensive component. Secondly, the patented technique is also characterized by volumetric inefficiency since, in effect, it comprises a socket mounted above a socket which is mounted above a printed circuit board; the uppermost socket being that in which the integrated circuit is packaged.

SUMMARY OF THE INVENTION

The present invention overcomes the above-briefly described and other deficiencies and disadvantages of the prior art by providing a unique technique for decoupling high frequency noise from a bus conductor which supplies power to an integrated circuit. The present invention also encompasses a unique decoupling capacitor for use in the practice of this novel method.

A decoupling capacitor in accordance with the present invention comprises a very thin rectangular chip of ceramic material which is metalized on the opposite sides. Leads are provided, respectively from the metalized coatings on the opposite sides of the ceramic chip, at two points which are adjacent a pair of diagonally opposed corners of the rectangularly shaped ceramic chip. These leads, which are themselves of rectangular cross section, extend outwardly a short distance generally in the plane of the metalized surface to which they are attached and are then bent downwardly so as to both extend in a direction which is transverse to the planes of the metalized surfaces. The entire assembly, with the exception of the two transversely extending lead portions, may then be encapsulated within a film of suitable non-conductive material.

The above-described ceramic capacitor, which may be dimensioned so as to be received in the space between the two rows of leads extending from a conventional dual-in-line integrated circuit, will be plugged into a printed circuit board, the leads from the capacitor being inserted in the board through-holes at which the ground and power supply conductors respectively terminate. The capacitor is inserted such that it remains spaced above the printed circuit board and is generally parallel therewith. The integrated circuit is then positioned over the capacitor and inserted in the board such that the power supply leads of the integrated circuit will be received in the same printed circuit board through-holes in which the capacitor leads have been inserted. The integrated circuit will typically be installed such that it is in abutting contact with the capacitor whereby the ceramic chip of the capacitor may function as a heat sink for the integrated circuit. Assembly is completed by soldering, in the conventional manner, the leads from the integrated circuit and capacitor to the printed circuit board with the spacing between the capacitor and board permitting cleaning and thus insuring that there will be no soldering flux trapped under the capacitor.

In an alternative embodiment and in accordance with the present invention, the decoupling capacitor is dimensioned so as to be mounted on top of the integrated circuit with the leads from the capacitor being inserted in the printed circuit board through-holes along with the power and ground supply conductors of the integrated circuit.

In yet another embodiment of the present invention, the integrated circuit is mounted or plugged in a conventional manner onto a first side of a printed circuit board. Thereafter, a decoupling capacitor is mounted on the back or second side of the circuit board in direct alignment with the integrated circuit such that the leads from the capacitor will share the same through-holes in the printed circuit board as the power and ground supply conductors of the integrated circuit.

BRIEF DESCRIPTION OF THE DRAWING

The present invention may be better understood and its numerous objects and advantages will become apparent to those skilled in the art by reference to the accompanying drawing wherein like reference numerals refer to like elements in the several figures and in which.

DESCRIPTION OF THE PREFERRED EMBODIMENT

Figure 1:
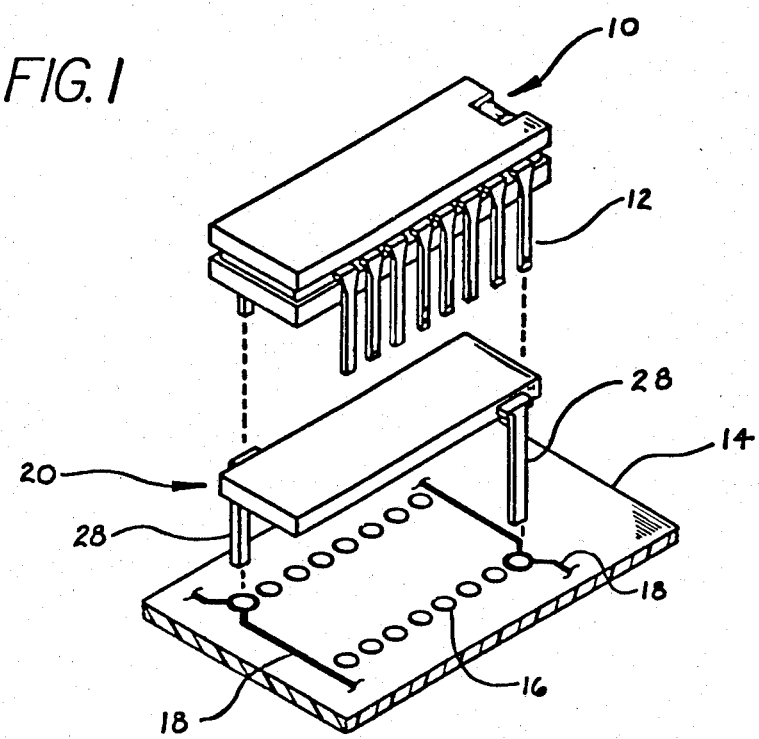
FIG. 1 is an exploded view which depicts practice of the present invention.

With reference now to the drawing, an integrated circuit is indicated generally at 10. Integrated circuit 10 is of the dual-in-line type. A plurality of connecting pins 12 extend downwardly from integrated circuit 10 as shown. A pair of diagonally opposite pins 12 respectively comprise the ground and power supply connections to circuit 10. Integrated circuit 10 is to be mounted on a printed circuit board which has been indicated schematically at 14. The circuit board will include a plurality of plated through-holes 16 which receive the pins 12 of circuit 10. Two of the through-holes 16 of board 14, which are positioned to receive the diagonally opposite ground and power supply connecting pins of circuit 10, will be electrically connected, by means of traces or conductors 18 formed on board 14, to the conductors of a power supply bus. There will, of course, be conductors 18 on board 16 for interconnecting all of the plated-through holes 16 with other circuit components and/or establishing interconnections between various of the pins 12 of circuit 10.

Figure 2:
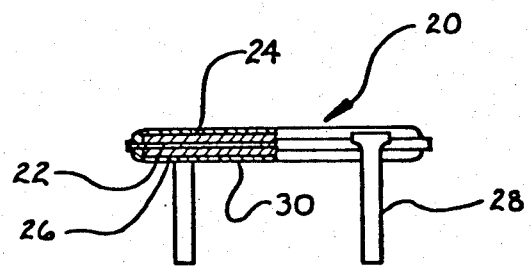
FIG. 2 is an enlarged side elevation view, partly in section, of the decoupling capacitor of FIG. 1.

As may be seen from FIG. 1, a decoupling capacitor, which has been indicated generally at 20, is positioned between integrated circuit 10 and printed circuit board 14. Decoupling capacitor 20 comprises a rectangularly shaped chip of ceramic material such as, for example, barium titanate (BaTiO$_3$) or strontium titanate (SrTiO$_3$). The opposite sides of chip 22 are metalized to define the plates 24 and 26 of a single layer capacitor. The metalizing may, for example, be silver or silver palladium ink, electrodeposited nickel or tin, copper, aluminum or zinc. Leads 28 are connected to the capacitor plates, i.e., respective of the metalized layers 24 and 26. The leads 28 extend outwardly a short distance in a direction which is generally parallel to the capacitor plates to which they are connected and then are bent, at 90°, to extend downwardly in a direction generally transverse to the planes of the metalized layers 24 and 26. It is important to note that the leads 28 are, like the power supply pins of integrated circuit 10, diagonally displaced with respect to the rectangular ceramic chip 22, i.e., the leads 28 extend from areas adjacent a pair of diagonally opposite corners of the decoupling capacitor 20. It is important to note that the leads 28 are, in cross section, of rectangular shape to minimize inductance. It is further to be noted that the leads 28 are positioned and configured such that they may be inserted in the same plated through-holes in board 14 which receives the ground and power supply pins of integrated circuit 10. The decoupling capacitor 20 is typically completed by encapsulation of the chip 22 and its metalized surfaces 24 and 26 by a thin layer of an insulating film such as, for example, MYLAR, TEDLAR or NOMEX. The encapsulation is indicated in FIG. 2 at 30.

In one use, the capacitor 20 will be inserted in the printed circuit board 14 to a point where the lower side thereof is closely spaced from the surface of board 14. This spacing is necessary to permit cleaning between printed circuit board 14 and capacitor 20 thereby insuring that there will be no soldering flux trapped under the capacitor. After the capacitor has been inserted in board 14, the integrated circuit 10 is positioned over the capacitor and all of its pins 12 inserted in through-hole 16 in board 14. In inserting integrated circuit 10 the ground and power supply pins will fit into the same through-holes 16 in board 14 which has received the leads 28 from capacitor 20. The integrated circuit 10 will preferably be inserted to the point where the underside thereof is in abutting contact with the upper side of the decoupling capacitor 20. Accordingly, the capacitor 20, particularly the ceramic chip 22, will act as a heat sink for integrated circuit 10 thus performing the dual functions of decoupling and helping to prevent over-heating of the integrated circuit.

Figure 3:
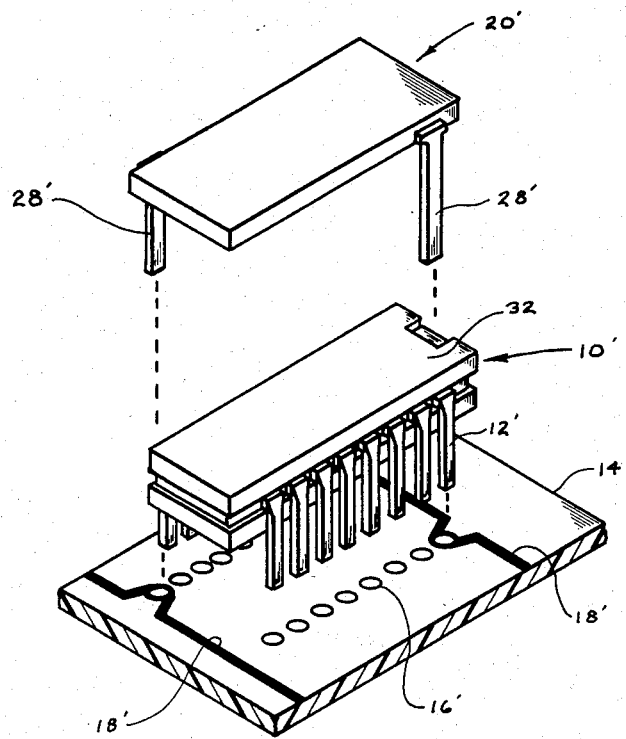
FIG. 3 is an exploded view which depicts practice of the present invention.
Figure 4:
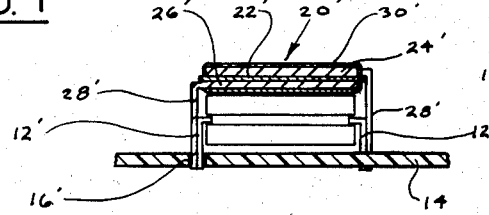
FIG. 4 is a cross-sectional elevation view of the decoupling capacitor/integrated circuit/printed circuit board assembly of the present invention.

Referring now to FIGS. 3 and 4, in an alternative embodiment of the present invention, decoupling capacitor 20' is mounted over the top surface 32 of integrated circuit 10'. Like the assembly shown in FIG. 1, in the assembly of FIGS. 3 and 4, leads 28' from capacitor 20' are received in the same through-holes 16' of board 14' as the ground and power supply connecting pin 12' of integrated circuit 10'. The completed assembly is shown in FIG. 4. As in the assembly of FIG. 1, capacitor 20' of FIGS. 3 and 4 will act as a heat sink for integrated circuit 10'.

Figure 5:
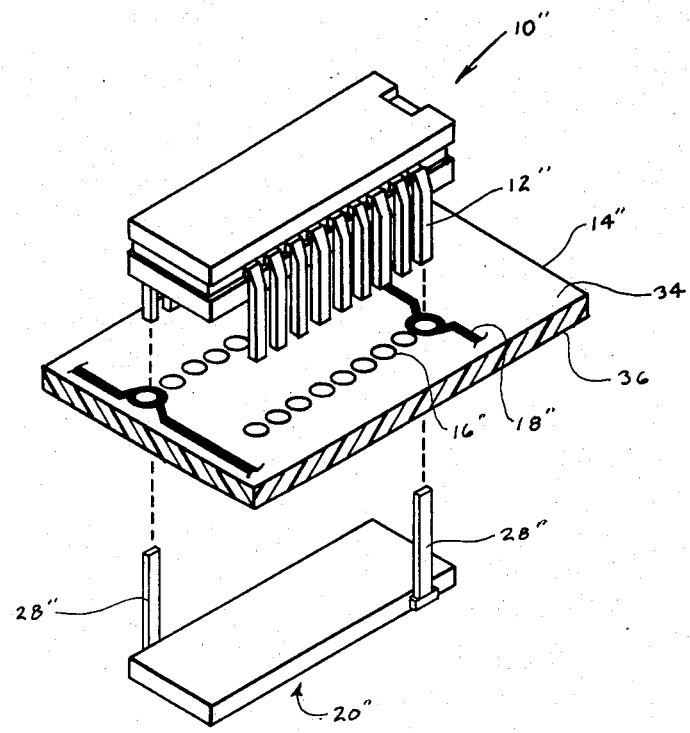
FIG. 5 is an exploded view which depicts practice of the present invention.
Figure 6:
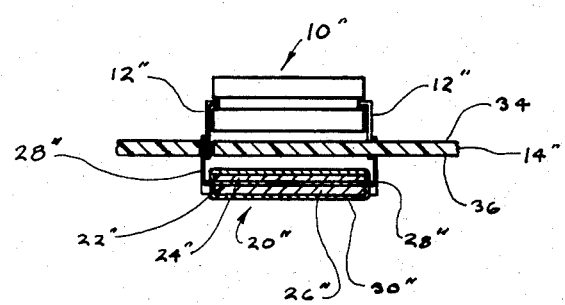
FIG. 6 is a cross-sectional elevation view of the decoupling capacitor/integrated circuit/printed circuit board assembly of the present invention.

Turning now to FIGS. 5 and 6, yet another embodiment of the present invention is shown. In this alternative assembly, integrated circuit 10" is mounted on printed circuit board 14" in a conventional and well known manner such that the plurality of plated through-holes 16 will receive pins 12" of integrated circuit 10". It will be appreciated that integrated circuit 10" is mounted on a first or front side 34 of printed circuit board 14". Decoupling capacitor 20" is mounted in alignment with and directly across from integrated circuit 10" on a second or back side 36 of printed circuit board 14". As in the embodiment of FIG. 3, leads 28" of capacitor 20" will share the same plated through-holes 16" as the ground and power supply leads of integrated circuit 10". It will be appreciated that the heat sink capabilities of the assemblies shown in FIGS. 1 and 3 will not be present with the assembly of FIGS. 5 and 6.

It will also be appreciated that the individual elements shown in FIGS. 3–6 are identical to those shown in FIGS. 1 and 2 except for the addition of a prime or double prime. The important distinctions between the FIG. 1, FIGS. 3 and 4, and FIGS. 5 and 6 embodiments are in the different manner of assembly. Each of the several assemblies may be preferable depending upon the particular application and other factors.

It is to be understood that the present invention has been described by way of illustration and not limitation.

What is claimed is:

1. An electronic subassembly comprising:
an integrated circuit package, said circuit package having a plurality of pins extending outwardly therefrom in the same direction, said integrated circuit package including a pair of power supply pins, said circuit package having a first surface;
a circuit board, said circuit board having spaced holes receiving said circuit package pins, said circuit board having opposed surfaces, said first surface of said integrated circuit package facing one of said opposed surfaces of said circuit board, a pair of spacially displaced of said holes defining power supply sockets, said integrated circuit package power supply pins being received in said power supply sockets; and
decoupling capacitor means, said decoupling capacitor means being mounted on the other of said opposed surfaces of said board and in alignment with said first surface of said circuit package, said capacitor means comprising:
a flat rectangular ceramic body having a pair of opposed surfaces;
a metalized coating on each of said pair of opposed surfaces of said ceramic body;
an insulating film encapsulating said ceramic body and metalized surfaces, said metalized coatings having conductors extending through said insulating film;
said conductors being received in said board power supply sockets along with said power supply pins of said integrated circuit package, said conductors extending outwardly and downwardly from points located adjacent opposite sides of said body.

2. The apparatus of claim 1 wherein said capacitor means conductors are of rectangular shape.

3. The apparatus of claim 1 wherein said capacitor means is spaced from said board.

4. The apparatus of claim 1 wherein said conductors extend outwardly and downwardly from points located adjacent a pair of opposite corners of said body.

* * * * *